(12) United States Patent
Goh

(10) Patent No.: US 7,603,573 B2
(45) Date of Patent: Oct. 13, 2009

(54) SYSTEM AND METHOD FOR OPTIMIZING COMPUTATIONAL DENSITY

(75) Inventor: Eng Lim Goh, Singapore (SG)

(73) Assignee: Silicon Graphics, Inc., Sunnyvale, CA (US)

( * ) Notice: Subject to any disclaimer, the term of this patent is extended or adjusted under 35 U.S.C. 154(b) by 527 days.

(21) Appl. No.: 11/585,619

(22) Filed: Oct. 24, 2006

(65) Prior Publication Data

US 2008/0155279 A1  Jun. 26, 2008

(51) Int. Cl.
*G06F 1/18* (2006.01)
(52) U.S. Cl. .............................. 713/300; 713/1; 703/22; 706/47
(58) Field of Classification Search ................. 713/300, 713/1; 703/18, 21, 22; 706/47; 718/104; 717/101, 104
See application file for complete search history.

(56) References Cited

U.S. PATENT DOCUMENTS

| | | | |
|---|---|---|---|
| 4,922,432 A | 5/1990 | Kobayashi et al. | |
| 5,197,016 A | 3/1993 | Sugimoto et al. | |
| 6,122,744 A * | 9/2000 | Rashkovskiy et al. | 713/300 |
| 6,167,330 A * | 12/2000 | Linderman | 700/295 |
| 6,247,134 B1 | 6/2001 | Sproch et al. | |
| 6,385,757 B1 | 5/2002 | Gupta et al. | |
| 6,408,428 B1 | 6/2002 | Schlansker et al. | |
| 6,507,947 B1 | 1/2003 | Schreiber et al. | |
| 6,578,176 B1 | 6/2003 | Wang et al. | |
| 7,082,521 B1 * | 7/2006 | Nanja | 713/1 |
| 7,353,378 B2 * | 4/2008 | Vaszary et al. | 713/100 |
| 2005/0125702 A1 * | 6/2005 | Huang et al. | 713/320 |

* cited by examiner

*Primary Examiner*—Thuan N Du
(74) *Attorney, Agent, or Firm*—Schwegman, Lundberg & Woessner P.A.

(57) ABSTRACT

A system and method of designing a computer system having a plurality of processors. A computational density is selected for the computer system, wherein the computational density is expressed as a function of a desired computational power for a given volume. A number of processors is selected for used in the computer system and the desired computational power is allocated across the selected number of processors. One or more constraints are selected and a particular processor is designed or selected to meet the allocated processor computational power and the constraint.

41 Claims, 7 Drawing Sheets

SYSTEM AND METHOD FOR OPTIMIZING COMPUTATIONAL DENSITY

FIELD OF THE INVENTION

The present invention is related to computer design, and more particularly to a system and method for optimizing computational density.

BACKGROUND INFORMATION

The overall hardware performance of a multiprocessor system is generally dependent on three factors: the productive processing power of each processor, the communications bandwidth of the interconnection amongst processors, and the communications latency amongst processors. Processing power continues to grow, as does communications bandwidth. Since the third factor, latency, is a function of the speed at which a signal can travel, communications latency will eventually be limited by the speed of light in vacuum (unless the current understanding of physics changes). Electrical signals are already being propagated, along high grade copper cables, at up to 80% the speed of light in vacuum. As such, there is not much room left for improvement. Consequently, as processor power and bandwidths continue to improve, the lack of corresponding improvement in communications latency will increasingly become the main limiting factor on the overall performance of a multiprocessor system.

One of the ways to reduce communications latency is to place processors increasingly closer together, so that the distances signals travel can be shortened. Correspondingly and positively, this also increases the amount of computing power in a unit volume (i.e., the "computational density"). As computational density increases, however, it can be difficult to dissipate the heat generated by processors placed in close proximity.

Multiprocessor computer designers are therefore faced with the problem of reducing communications latency and increasing computational density while at the same time ensuring adequate heat dissipation.

BRIEF SUMMARY OF THE INVENTION

A system and method is disclosed for designing a computer system having a plurality of processors. For a new computer system to be designed, the user specifies some constraints (e.g., a physical volume and a heat dissipation budget). The method then maximizes computational power within these constraints, balancing between, for example, using fewer higher-powered processors placed further apart and using more lower-powered processors placed closer together. A particular processor is then designed or selected from a list to provide the desired computational power.

DESCRIPTION OF THE PREFERRED EMBODIMENTS

Figure 1:
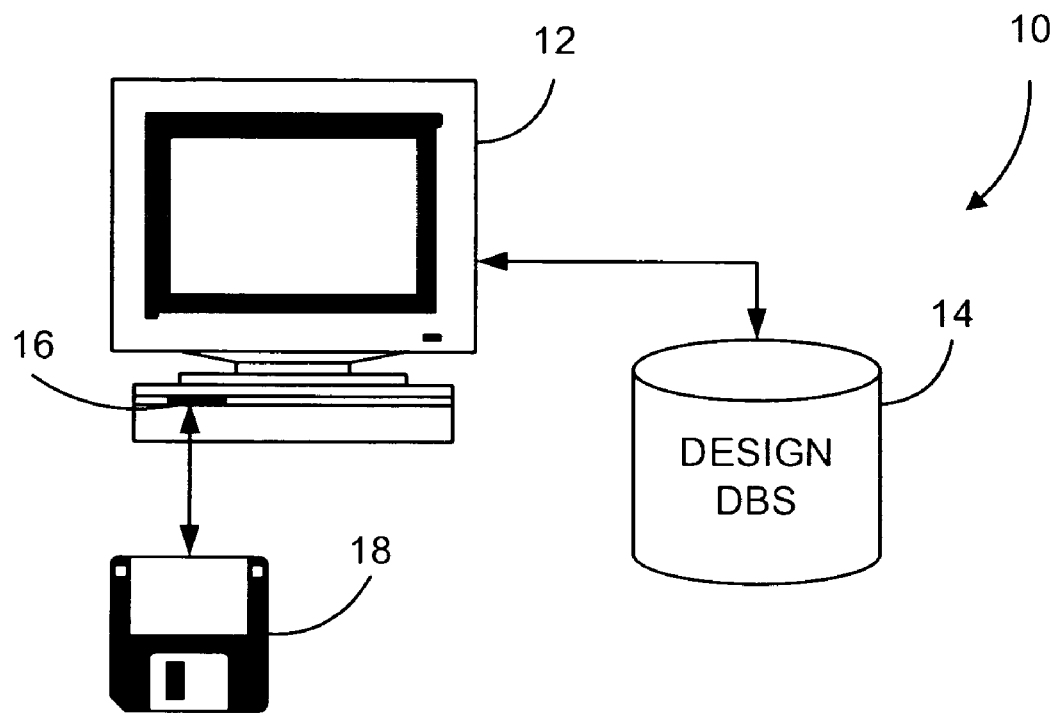
FIG. 1 illustrates a computer design system.

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Powerful multiprocessor systems can be designed with high-powered processor-chips. Heat from these processor-chips must then be conveyed outside the system. In some systems, this process involves complicated and expensive cooling methodologies, i.e. from complex air cooling, liquid cooling to state-change or evaporative cooling methods. In other systems, the processor-chips are deliberately placed far enough from each other to allow adequate heat dissipation, so that simpler and less expensive forced air convection cooling methods can be used. In yet other systems, cooler but slower and less functional processors are deliberately used. In increasing computational density, the first approach ends up reducing system reliability and increasing expense (needed to alleviate the reduced reliability and to implement the complex cooling methodologies). The second approach tends to limit the number of processor-chips in a given physical volume and, therefore, driving up communication latency and reducing computational density. Though the third approach allows for high density packing of processor-chips, high computational density is not necessarily achieved because the individual processor-chips are slower than what are generally available.

It is important to also note that even with the advent of multi-core processor-chips, the above same arguments apply. As such, we will use the term "processor" to refer to a processor-chip that may contain one or many cores.

Until recently, it has been a general systems design practice to increase overall multiprocessor performance by increasing the clock speed at which the microprocessors run, and therefore the amount of heat they generate. Faster clock speeds give rise to higher heat dissipation from all the processors, and given a constant system cooling budget, this means processors have to be placed further apart, increasing communications latencies and reducing computational densities. In other words, given a fixed systems cooling budget, as the clock speed of processors increase, the speed of light limit will make multiprocessor systems sparser.

Multiprocessor systems can also be designed with lower-powered processors that can be placed closer together, but then the aggregate system's processing power may be unnecessarily lowered.

As an example, existing approaches to 64-bit high-end microprocessor designs have mostly focused on driving these processors hard, motivated by the need to competitively maximize single processor performance. In doing so, designers often drive such processors to higher and higher electrical power levels; as evidenced by current 64-bit microprocessors commonly consuming between 50 and 150 watts.

Higher electrical power consumption gives rise to higher heat dissipation. Consequently, in a multi-processor system, these microprocessors, while positively achieving higher computing power on their own, negatively constrain their neighboring processors to be, thermally, placed further away. This substantially increases communications latency and lowers overall system density.

Moreover, the returns from increased computing power may be approaching the asymptotic phase for most synchronously clocked microprocessor designs. In other words, feeding them with more electrical power is starting to give increasingly diminishing returns. Consequently, what is gained in increased performance from a single processor is far from being able to make up for the increasingly substantial drop in overall multi-processor systems density; for the same cooling or thermal dissipation budget. What is needed is a system and method of balancing processor power, communications bandwidth and communications latency, to optimize computational density when designing a multiprocessor system.

As noted above, one should consider three fundamental factors affecting high-performance computing (HPC) designs; compute power, bandwidths and latencies. As compute power and bandwidths continue to grow (for years yet), latencies will be limited, much earlier, by the speed of light. As such multi-processor systems, made up of sparse but powerful individual processors, will eventually be limited by interconnect-crossing communications.

How can we solve this problem? The compute side of HPC systems is becoming more and more integrated. For example, many designers plan to incorporate the memory controller on the same microprocessor chip. Consequently, the compute side of the HPC system will eventually be just a collection of entities made up of a chip (including microprocessor(s), cache and memory controller) connected to memory chips. What is described below is a system and method of balancing processor power, communications bandwidth and communications latency, to optimize computational density of such processor designs when designing a multiprocessor system. In one embodiment, the system and method consider other parameters such as the cost of components, reliability or fault tolerance.

For those who design their own microprocessors, a microprocessor designed according to this methodology can be designed with a power-consumption envelope that is inherently linked to the overall systems optimization process. That is, one can design the microprocessor for a fixed thermal dissipation budget, with the goal of maximizing the total compute power per given HPC system's volume.

At the same time, for those designing with commodity microprocessors, this method can be used to select a microprocessor that, while not the fastest or most powerful, is instead the one that provides the best power-consumption/performance envelope for the application for which the HPC is being designed.

In view of this, a system and method is disclosed for designing a computer system having a plurality of processors. In one embodiment, for a new computer system to be designed, the user specifies two constraints: a physical volume and a heat dissipation budget. The method then maximizes computational power within these constraints. It does so by working out an optimum point between using fewer higher-powered processors placed further apart and using a higher number of lower-powered processors placed closer together. A particular processor is then designed or selected from a list. The system then determines the number of the selected processors needed to meet the initially specified constraints.

One embodiment of a computer design system 10 for designing a computer to a particular computational density is shown in FIG. 1. In the embodiment shown in FIG. 1, system 10 includes a workstation 12 connected to a design database 14. In one such embodiment, workstation 12 includes program code for designing a computer according to the present invention. In addition, design database 14 includes information on processors or processor designs that can be used to design the computer under design.

In one embodiment, workstation 12 includes a device 16 for reading computer readable media. In one such embodiment, program code for designing a computer according to the present invention is stored for transport on computer readable media 18; device 16 reads the program code from computer readable media 18.

Figure 2:
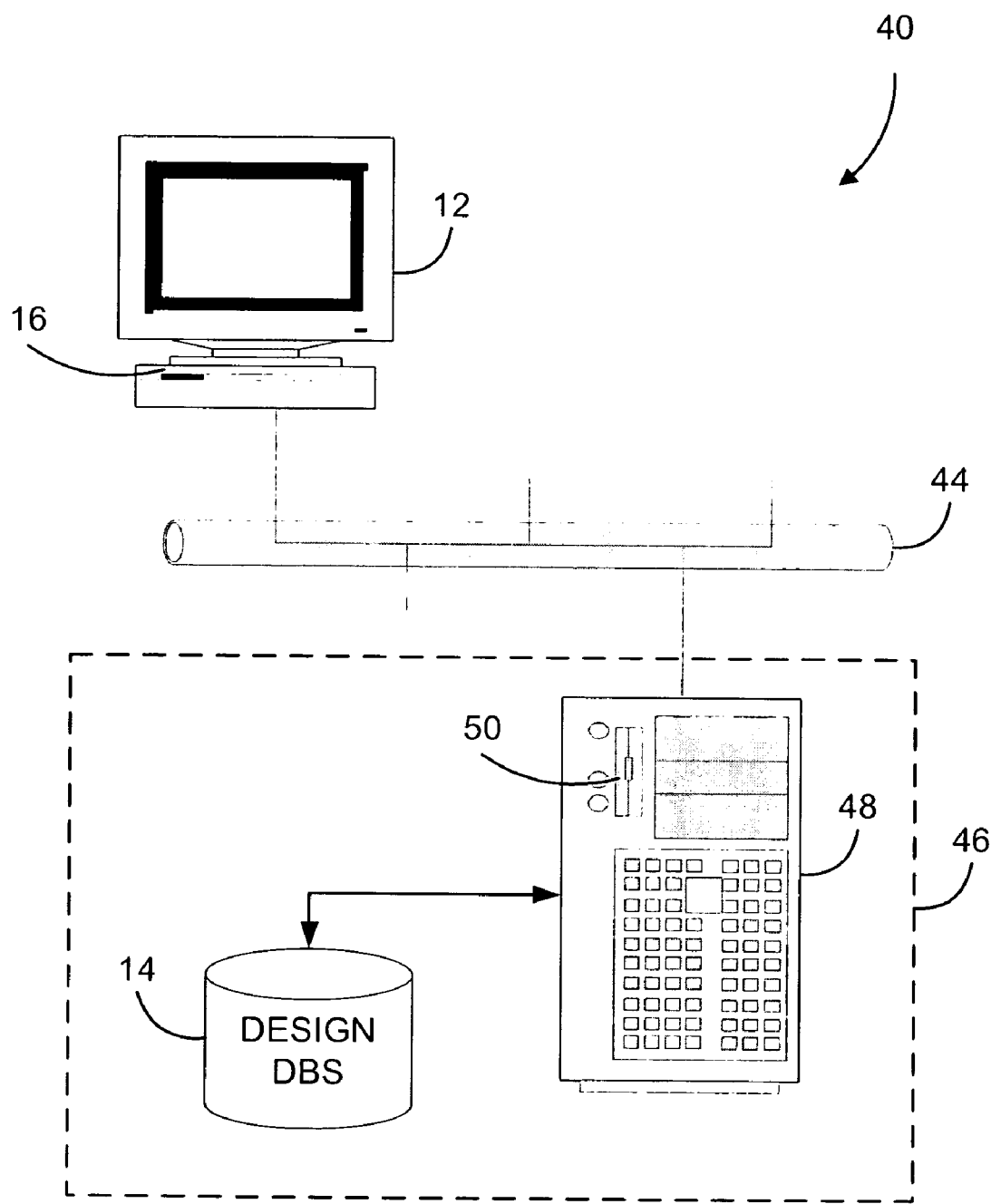
FIG. 2 illustrates another computer design system.

Another embodiment of a computer design system for designing a computer is shown in FIG. 2. In the embodiment shown in FIG. 2, computer design system 40 includes a workstation 12 connected through a network 44 to a server 46 connected to design database 14. In one such embodiment, workstation 12 executes program code for designing a computer according to the present invention. In one embodiment, design database 14 includes information on processors or processor designs.

In one embodiment, workstation 12 includes a device 16 for reading computer readable media. In one such embodiment, program code for designing a computer according to the present invention is stored for transport on computer readable media (not shown); device 16 reads the program code from the computer readable media.

In another embodiment, server 46 includes a device 50 for reading computer readable media. In one such embodiment, program code for designing a computer according to the present invention is stored for transport on computer readable media (not shown); device 50 reads the program code from the computer readable media.

Figure 3:
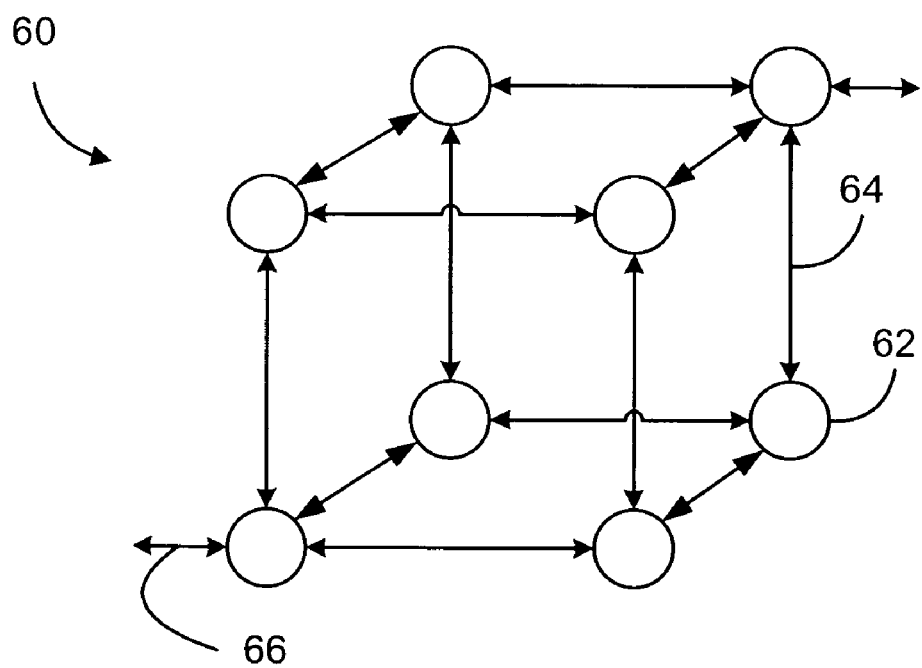
FIG. 3 illustrates a multiprocessor computing system.

A multiprocessor computer system 60 is shown in FIG. 3. In the computer system of FIG. 3, computer system 60 includes processor nodes 62 connected by links 64. One or more processor nodes 62 are connected to input/output (I/O) by links 66.

In one embodiment, the computer designer starts with a given volume and determines the amount of computational power desired out of the volume. The designer then selects the microprocessor and other components which provide the greatest computational power for the given volume for the application for which the system is being designed. In one such embodiment, this is an iterative process. An optimal computational density may, for instance, require slightly more heat dissipation than originally budgeted. Or a slightly relaxed computational density may provide a better price point.

In one embodiment, a Multi-Disciplinary Design Optimization (MDO) simulation software program runs and scans for the best trade-off between the power to supply to the microprocessors to obtain good compute power returns and the power dissipated by those microprocessors, so that you can pack them at higher densities. In one such embodiment, a design goal is to maximize the compute power in a given systems volume; while minimizing latencies between the microprocessors.

Figure 4:
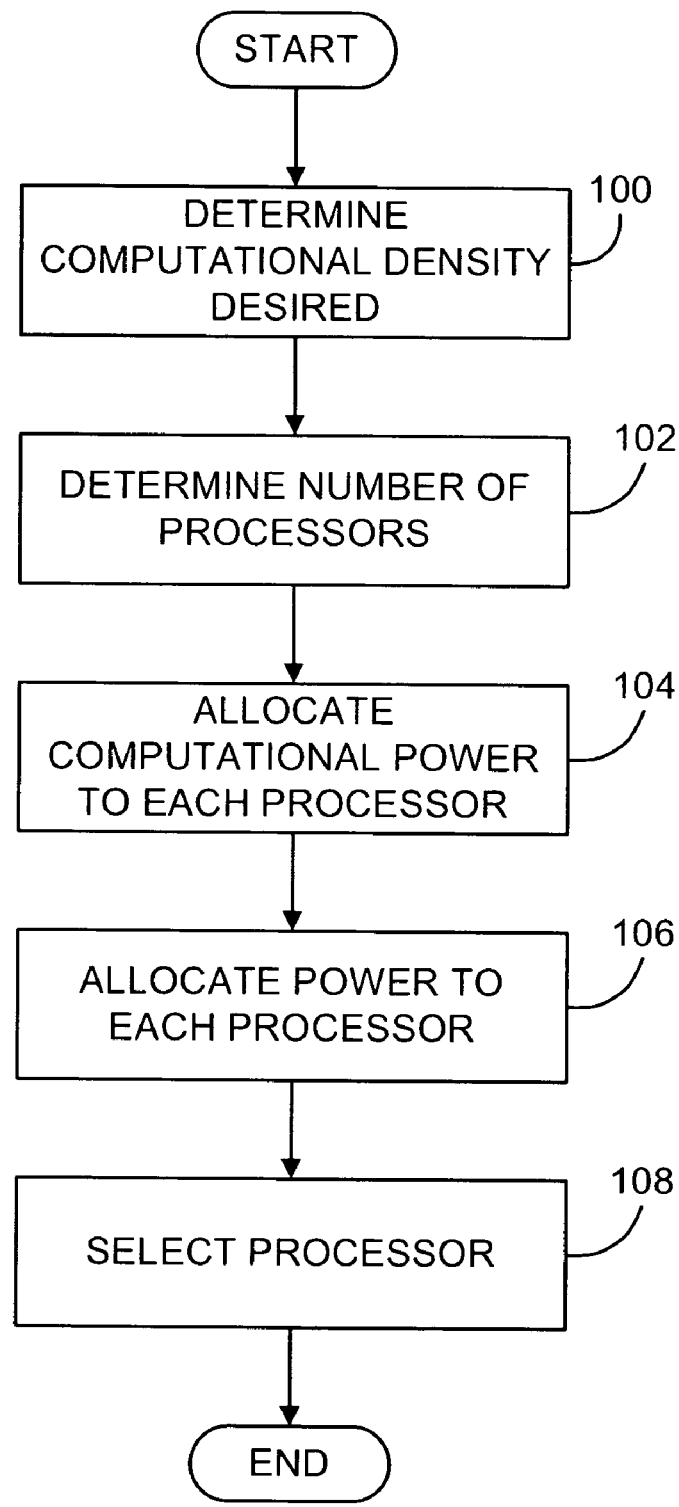
FIG. 4 illustrates a method of designing a computer system.

A method of designing a computer system 60 will be described next. In one embodiment, system 10 (or 40) includes an MDO program. In one embodiment, as is shown in FIG. 4, the computer designer enters a computational density into the MDO program at 100. For instance, the designer might want a 5 TFLOP computer system to fit within a 600 liter cabinet. The power supply and cooling equipment take up 100 liters of the cabinet. That means that the computational density of the computer system will be 10 MFLOPS/liter. The designer does not care at this point whether the 5 TFLOPS come from 4 or 6 or 64 processors.

The designer enters the number of nodes in the system at 102. In one embodiment, each node includes a processor and memory.

In one embodiment, the type of computer architecture is predefined as part of the MDO program (i.e., a mesh or torus network is predefined). In another embodiment, the designer enters an interconnect scheme used to connect the nodes (bus, mesh, etc.) and the bandwidth for each interconnect at 102.

The program executing in workstation 12 (or in server 46) allocates at 104 processor computational power to each node 62 as a function of the computational density selected. The program also allocates at 106 a processor power budget to each node 62 as a function of a power budget for computer system 60. A processor design is then selected at 108 to meet the allocated processor computational power and the allocated processor power budget.

Figure 5:
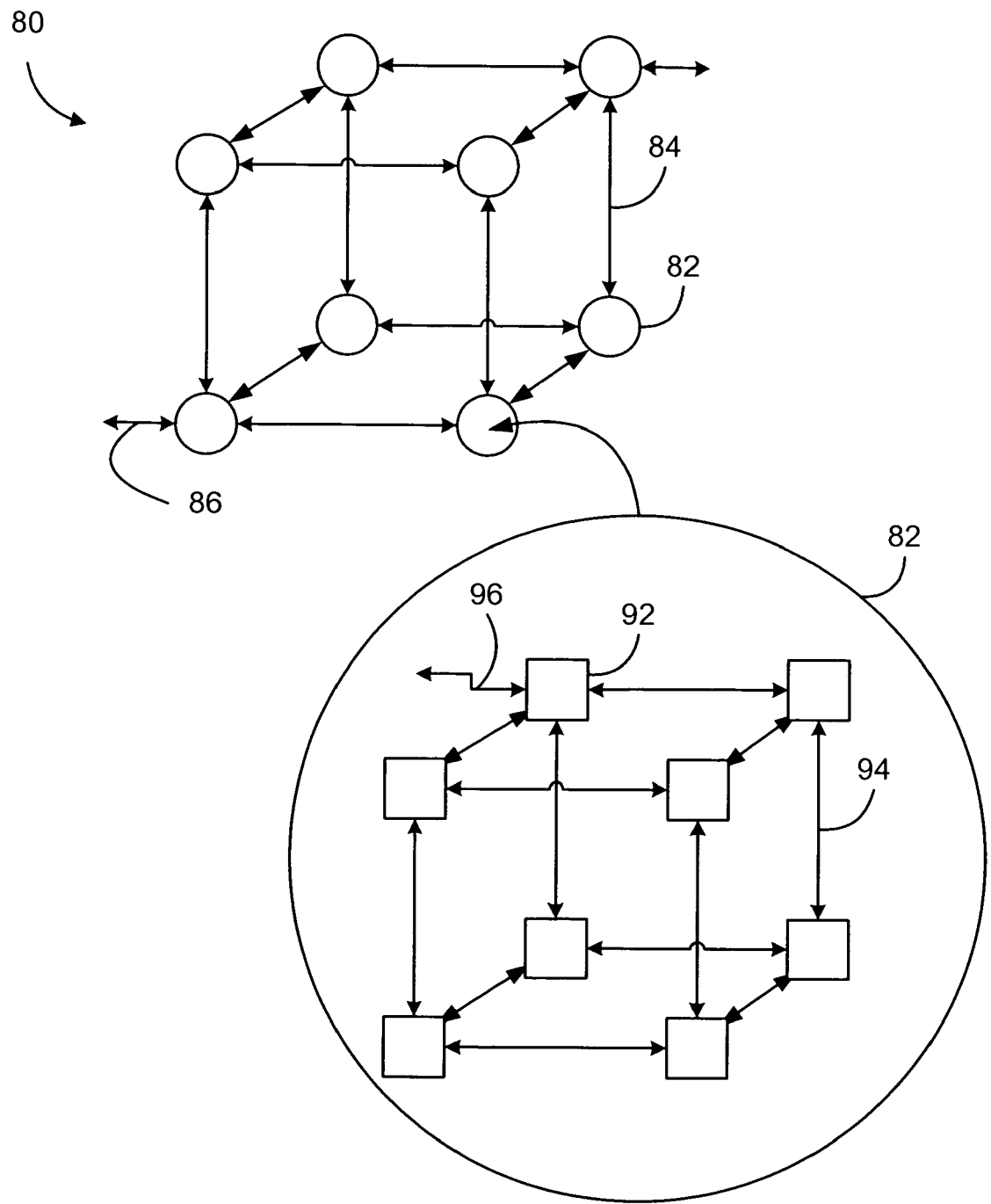
FIG. 5 illustrates a multiprocessor computing system which has more than one processor per processor node.
Figure 6:
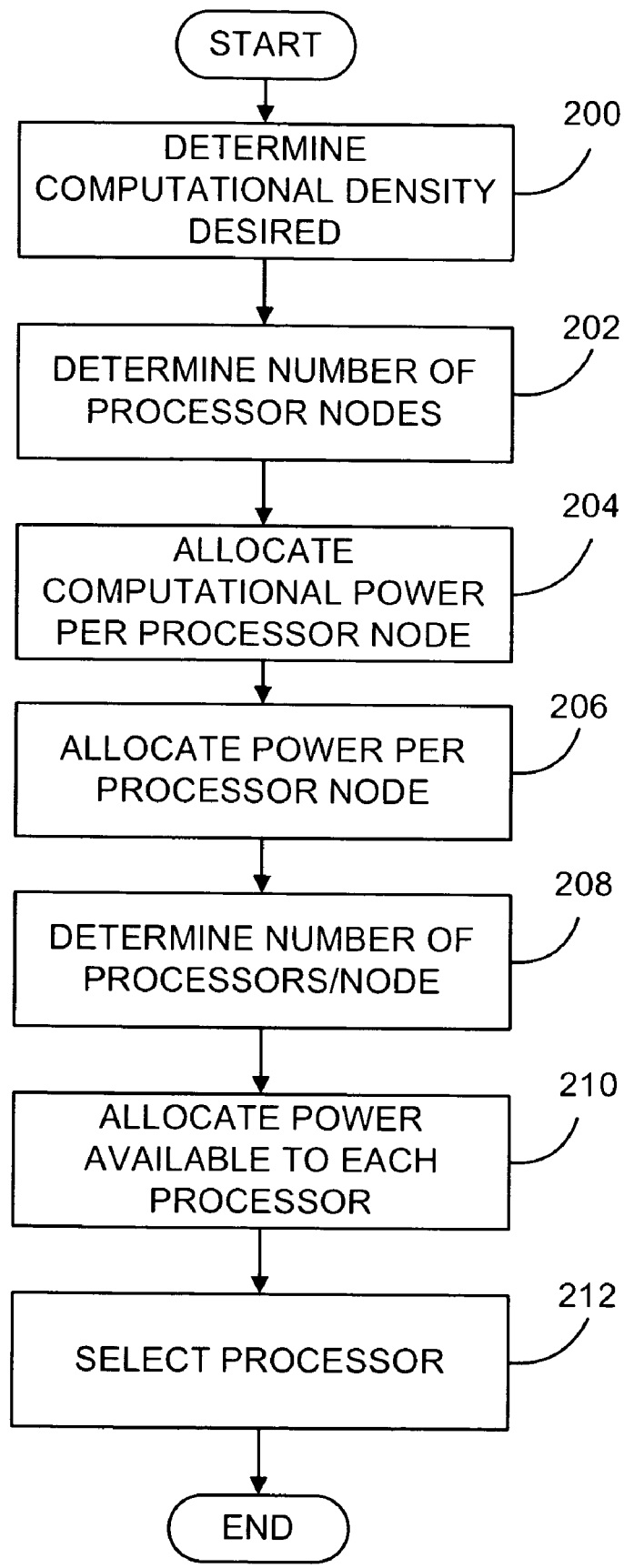
FIGS. 6-8 illustrate other methods of designing a computer system.

Some computer systems have more than one processor at a processor node 62. An example of such a computer system 80 is shown in FIG. 5. In the computer system of FIG. 5, computer system 80 includes processor nodes 82 connected by links 84. One or more processor nodes 82 are connected to input/output (I/O) by links 86. Each processor node 82 includes processors 92 connected by links 94 to each other and by links 96 to links 84 and, where appropriate, to links 86. A method of designing such a system is shown in FIG. 6.

In one embodiment, system 10 (or 40) includes an MDO program as described above. In one embodiment, as is shown in FIG. 6, the computer designer enters a computational density into the MDO program at 200. For instance, the designer might want a 10 TFLOP computer system to fit within a 600 liter cabinet. The power supply and cooling equipment take up 100 liters of the cabinet. That means that the computational density of the computer system will be 20 MFLOPS/liter.

The designer enters the number of processor nodes 82 in the system at 202. In one embodiment, the type of computer architecture is predefined as part of the MDO program (i.e., mesh or torus). In another embodiment, the designer enters an interconnect scheme used to connect the nodes 82 (bus, mesh, etc.) and the bandwidth for each link 84 and 86 at 102.

The program executing in workstation 12 (or in server 46) allocates at 204 processor node computational power to each processor node 82 as a function of the computational density selected. The program also allocates at 206 a processor node power budget to each processor node 82 as a function of a power budget for computer system 80.

Control then moves to 208, where the designer enters the number of processors 92 in each processor node 82. In one embodiment, the type of architecture used for processor node 82 is predefined as part of the MDO program. In one such embodiment, the designer also enters an interconnect scheme used to connect the processors 92 (bus, mesh, etc.) and the bandwidth for each link 94 and 96 at 208.

The program executing in workstation 12 (or in server 46) allocates at 210 processor computational power to each processor 84 as a function of the processor node computational power allocated at 204. The program also allocates at 212 a processor power budget to each processor 84 as a function of the processor node power budget allocated at 206.

A processor design is then selected at 212 to meet the allocated processor computational power and the allocated processor power budget.

In one embodiment, processor designs are selected from predefined processor designs. The designs may include, for instance, commercial processor designs.

Therefore systems 10 and 40 attempt to find an optimal solution between how hard you can drive a processor or microprocessor, the temperature it dissipates and the distance between each processor or microprocessor. A designer may run each microprocessor a little slower, or at a lower voltage, in order to be able to place the processors closer together. At some point in the voltage/frequency/distance, optimization, system 10 arrives at the maximum computational power in a unit volume.

There are a wide variety of ways of expressing computational density. Computational power can be expressed as floating point operations per second (FLOPS), as operations per second (OPS), or as a function of benchmarks. A designer who designs based on benchmarks is able to tune the performance of the computer to particular applications. One widely used benchmark is the SPEC CPU2000 suite compiled by the Standard Performance Evaluation Corporation.

In one embodiment, other factors beyond power dissipation and computational power are considered. In one such embodiment, processor selection is a three parameter optimization of computational performance, heat dissipation and communications latency due to distance between nodes 82. In another embodiment, processor selection is a four parameter optimization. In addition to computational performance, heat dissipation and communications latency due to distance between nodes 82, another factor may be system or processor cost, communications bandwidth between nodes 82, reliability or fault tolerance. Other factors (e.g., system noise generated, processor cost, processor voltage requirements, etc.) can be used as well to arrive at an optimal computational density.

In one embodiment, processors are characterized for processor computational power and processor power output across a variety of frequencies and voltages and selection of a processor includes examining processor characteristics across different voltages and frequencies.

Benchmarks which accentuate data transfer and communication latency (such as Eclipse/52) will tend to favor designs which do better in these areas. For instance, such a benchmark may favor low latency, high bandwidth links between processor nodes. On the other hand, benchmarks which emphasize raw computing power (such as Ansys/2, BLAST/16 and FASTA/16) will tend to favor high computational power over communication bandwidth.

In one embodiment, a designer tunes the system to the application being executed. For instance, an application with a lot of relatively small communications can thrive on a system with very fast, albeit narrow pipes between processors while one that communicates in relatively infrequently but with large chunks of data may need greater communications bandwidth. The latter application may do better on a system having wider pipes, even if the latency of transfer between nodes increases. Benchmarks geared toward the actual application will tend to favor the appropriate design.

Figure 7:
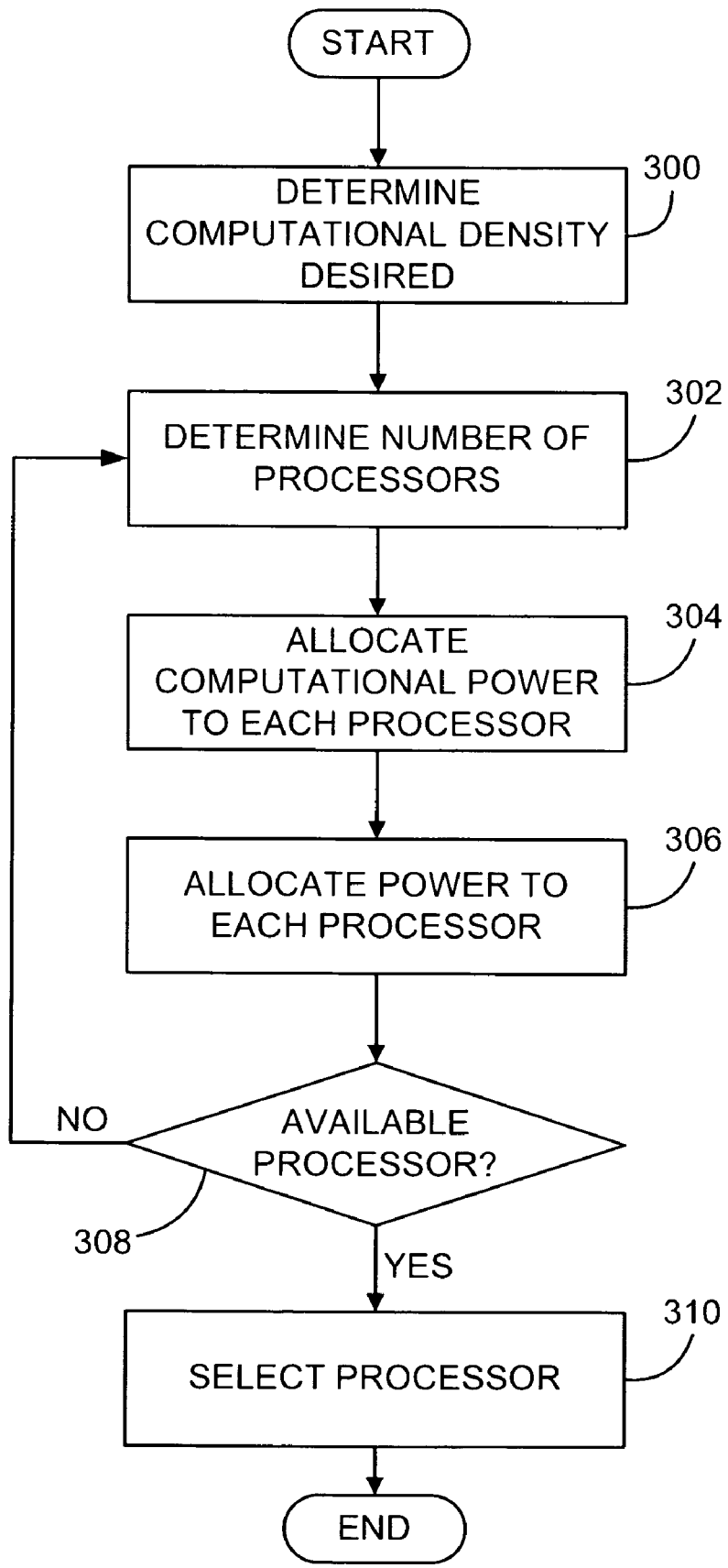

In one embodiment, selection of the optimum processor, and the voltage, frequency, etc., in which the processor operates is an iterative function. One such embodiment is shown in FIG. 7. In embodiment shown in FIG. 7, the designer enters the number of nodes in the system at 302. In one embodiment, the type of computer architecture is predefined as part of the MDO program (i.e., mesh or torus). In another embodiment, the designer enters an interconnect scheme used to connect the nodes (bus, mesh, etc.) and the bandwidth for each interconnect at 302.

At 304, the program executing in workstation 12 (or in server 46) allocates processor computational power to each processor 62 as a function of the computational density selected. The program also allocates at 306 a processor power budget to each processor 62 as a function of a power budget for computer system 60. A number of potential processor designs are evaluated at 308 to determining if an available processor approximates the allocated processor computational power and the allocated processor power budget. If so, control moves to 310 and the processor is selected for system 60.

If, however, no available processor meets the allocated processor computational power and the allocated processor power budget, a different quantity of processors is selected at 302 and the process executes again.

The present invention describes a system and method for designing a computer system as a function of a heat dissipation budget allocated to the computer designer. The process may be iterative. The system architect may allocate a given heat dissipation budget to a processor designer. That heat dissipation budget is based in part on the distance between the processors under design. The processor designer may find that he or she is incapable of working within that budget and may ask, for instance, for five more watts per processor. The system architect could then go back to the simulation, determine how much further apart the higher heat processors have to be to keep the same heat dissipation per unit volume and determine the effect on the computational density for the system under design.

On the other hand, the process designer may determine that he or she can obtain nearly the same performance with lower than the budgeted heat dissipation. The system architect feeds this data back into his model to see the effect of moving the cooler processors closer together. The result is a system in which the component parts are designed for maximum density for a given heat dissipation envelope.

The concepts discussed above can be extended to the selection of other components as well. For example, the selection of memory components and the memory controller contribute not only to performance but to achievable power density as well. For instance, the designer may trade off one memory architecture against another less computationally efficient architecture if the resulting architecture brings the processor node within a desired computational density. The same paradigm can be extended to bus structures employed within node 82.

In one embodiment, the designer works from a library of design choices when designing each processor node. In one embodiment, the library includes all component choices available to the designer and a characterization of the aspects of that component that contribute to the system quality or qualities being constrained.

In one such embodiment, where the designer is trying to reach an optimal computational density, design choices may include not only the available processors but also the types of memory and memory architectures that will operate with each processor. Each processor, for instance, may operate with certain memory chips and in certain memory configurations (i.e., single bank vs. dual bank memory). Some may require a separate memory controller. Each design choice is a factor to be considered in determining an optimal computational density.

Figure 8:
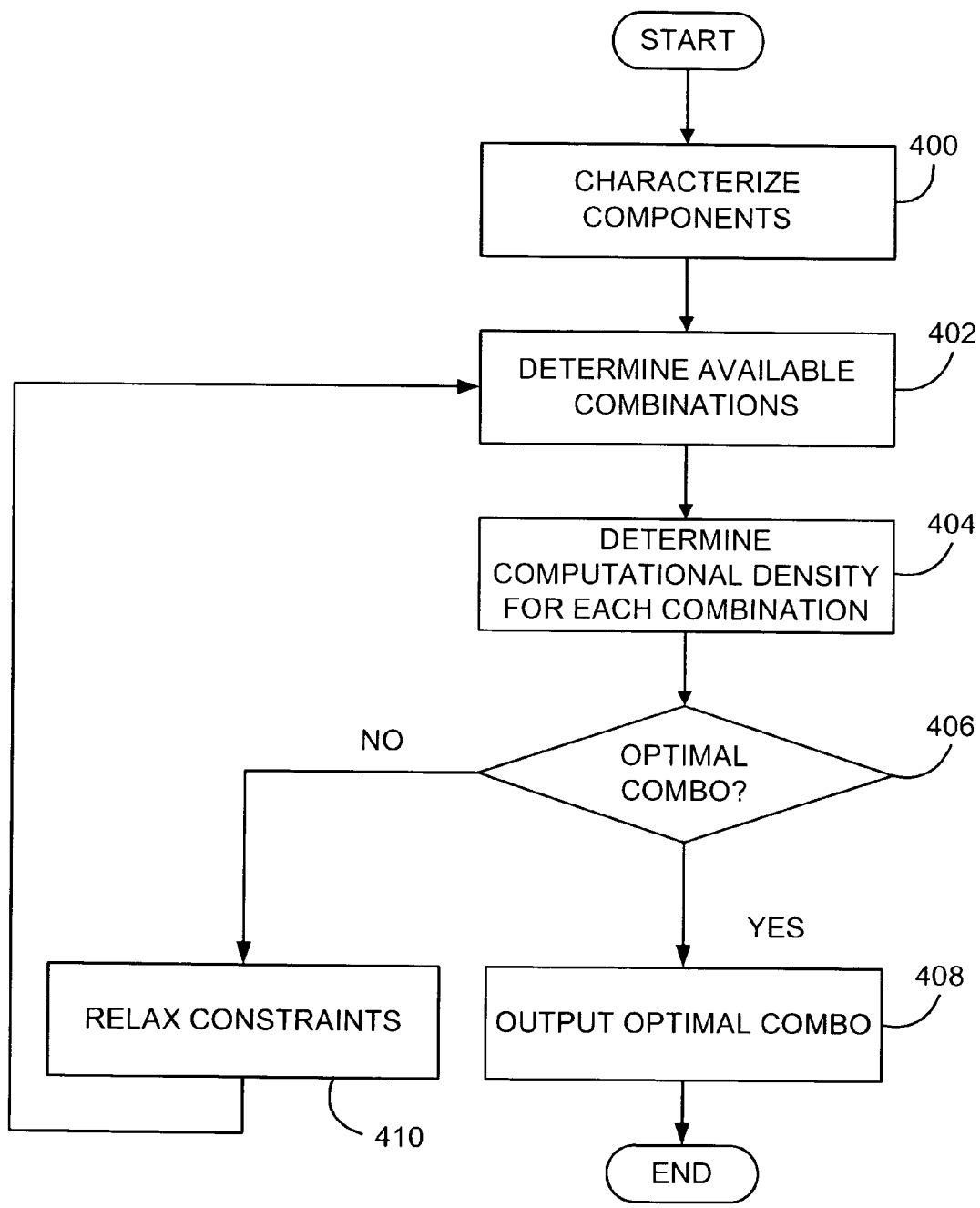

A method of selecting components for a processor node 82 is shown in FIG. 8. In the method of FIG. 8, each component is characterized for the particular quality or qualities being optimized. Components may be characterized as a function of variables such as current, voltage drop or clock frequency. In one embodiment, when their individual contributions to the quality being tested is small, components are lumped together to simplify the calculation.

For example, if the major contributors to heat generation are the processor, the memory and the memory controller, the remaining components are lumped together and characterized by a single power dissipation, or by an equation that characterizes power dissipation as a function of voltage drop or clock frequency, or both. In this example, therefore, the optimization would be based on four types of components: processor, memory, memory controller and other components.

In this example, there are four processors under consideration. Two of the processors include a memory controller that can support either single or dual-banked memory. Two of the processors require an external memory controller, and there are two memory controllers that are under consideration. Finally, there are three types of memory being considered for the design.

It can be seen that the number of permutations being considered can expand exponentially.

Turning to FIG. 8, at 400 each of the components is characterized for its contribution to heat generation and computational power as a function of voltage and clock frequency. In one approach, only the processor, memory and memory controller contribute to computational power; the component that represents the lumped components is modeled as a heater that simply generates heat as a function of voltage and clock frequency.

At 402, all available combinations of the four components are mapped and, at 404, computational density of each combination is calculated. At 406, a check is made to see if the optimal combination provides a computational density within the desired range of computational density. If so, control moves to 408 and the combination having the highest computational density is selected. If not, system constraints are relaxed (or new components considered) at 410 and control moves to 402 for a new iteration.

As noted above, factors other than power dissipation and computational power are considered. In one such embodiment, processor selection is a three parameter optimization of computational performance, heat dissipation and communications latency due to distance between nodes 82. In another embodiment, processor selection is a four parameter optimization. In addition to computational performance, heat dissipation and communications latency due to distance between nodes 82, another factor may be system or processor cost, communications bandwidth between nodes 82, reliability or fault tolerance.

In the above discussion and in the attached appendices, the terms "computer" and "computer system" are defined to include any digital or analog data processing unit. Examples include any personal computer, workstation, set top box, mainframe, server, supercomputer, laptop or personal digital assistant capable of embodying the inventions described herein.

Examples of articles comprising computer readable media are floppy disks, hard drives, CD-ROM or DVD media or any other read-write or read-only memory device.

Portions of the above description have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussions, terms such as "processing" or "computing" or "calculating" or "determining" or "displaying" or the like, refer to the action and processes of a computer system, or similar computing device, that manipulates and transforms data represented as physical (e.g., electronic) quantities within the computer system's registers and memories into other data similarly represented as physical quantities within the computer system memories or registers or other such information storage, transmission or display devices.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of designing a computer system having a plurality of processors, the method comprising:
   providing a plurality of component choices for each processor;
   selecting a computational density for the computer system, wherein the computational density is expressed as a function of a desired computational power for a given volume;
   selecting a number of processors to be used in the computer system;
   allocating the desired computational power across the selected number of processors;
   selecting a constraint; and
   selecting a component choice from the plurality of component choices such that the allocated processor computational power and the constraint are met.

2. The method of claim 1, wherein the constraint is power dissipation per unit volume.

3. The method of claim 1, wherein the constraint is selected from a group including cost per unit volume and reliability.

4. The method of claim 1, wherein the constraint is reliability across the computer system.

5. The method according to claim 1, wherein the computational density is expressed in operations per second for a given volume.

6. The method according to claim 1, wherein the computational density is expressed in performance on a performance benchmark for a given volume.

7. The method according to claim 1, wherein selecting a number of processors includes selecting a method of interconnecting the processors.

8. An article comprising a computer readable medium having instructions thereon, wherein the instructions, when executed in a computer, create a system for executing the method of claim 1.

9. The method according to claim 1, wherein selecting a constraint includes selecting one or more constraints from a plurality of constraints including power dissipation, reliability and cost and allocating portions of the selected constraints across the selected number of processors.

10. The method according to claim 1, wherein selecting a number of processors includes selecting a number of processor nodes, selecting a number of processors per node and selecting a method of interconnecting the processors.

11. A method of designing a computer system having a plurality of processors, the method comprising:
    selecting maximum power dissipation for the computer system;
    selecting a quantity of processors;
    allocating a processor power budget to each processor as a function of the maximum power dissipation selected for the computer system;
    allocating a processor computational power to each processor as a function of a desired computational density; and
    designing the processor to meet the allocated processor computational power and the allocated processor power budget.

12. The method according to claim 11, wherein the computational density is expressed in floating point operations per second for a given volume.

13. The method according to claim 11, wherein the computational density is expressed in operations per second for a given volume.

14. The method according to claim 11, wherein the computational density is expressed in performance on a performance benchmark for a given volume.

15. The method according to claim 11, wherein selecting a number of processors to be used in the computer system includes selecting a method of interconnecting the processors.

16. The method according to claim 11, wherein designing the processor includes simulating execution of an application program on a given processor design.

17. The method according to claim 11, wherein designing the processor includes determining processor computational power and processor heat generation for the processor as a function of clock frequency.

18. The method according to claim 11, wherein designing the processor includes determining processor computational power and processor heat generation for the processor as a function of processor voltage.

19. An article comprising a computer readable medium having instructions thereon, wherein the instructions, when executed in a computer, create a system for executing the method of claim 11.

20. A method of designing a computer system having a plurality of processors, the method comprising:
    selecting a computational density for the computer system;
    selecting a quantity of processors;
    allocating a processor computational power to each processor as a function of the computational density selected;
    allocating a processor power budget to each processor as a function of a power budget for the computer system; and
    selecting a processor design that meets the allocated processor computational power and the allocated processor power budget.

21. The method according to claim 20, wherein the computational density is expressed in floating point operations per second for a given volume.

22. The method according to claim 20, wherein the computational density is expressed in operations per second for a given volume.

23. The method according to claim 20, wherein the computational density is expressed in performance on a performance benchmark for a given volume.

24. The method according to claim 20, wherein selecting a quantity of processors includes selecting a method of interconnecting the processor nodes.

25. An article comprising a computer readable medium having instructions thereon, wherein the instructions, when executed in a computer, create a system for executing the method of claim 20.

26. A method of designing a computer system having a plurality of processors, the method comprising:
  a) selecting a computational density for the computer system;
  b) selecting a quantity of processors;
  c) allocating a processor computational power to each processor as a function of the computational density selected;
  d) allocating a processor power budget to each processor as a function of a power budget for the computer system;
  e) determining if an available processor approximates the allocated processor computational power and the allocated processor power budget; and
  f) if no available processor meets the allocated processor computational power and the allocated processor power budget, selecting a different quantity of processors and repeating c-f.

27. The method according to claim 26, wherein the computational density is expressed in floating point operations per second for a given volume.

28. The method according to claim 26, wherein the computational density is expressed in operations per second for a given volume.

29. The method according to claim 26, wherein the computational density is expressed in performance on a performance benchmark for a given volume.

30. The method according to claim 26, wherein selecting a quantity of processors includes selecting a method of interconnecting the processor nodes.

31. An article comprising a computer readable medium having instructions thereon, wherein the instructions, when executed in a computer, create a system for executing the method of claim 26.

32. A method of designing a computer system having a plurality of processors, the method comprising:
  selecting a computational density for the computer system;
  selecting a quantity of processors;
  allocating a processor computational power to each processor as a function of the computational density selected;
  allocating a processor power budget to each processor as a function of a power budget for the computer system; and
  selecting a processor design from a plurality of processor designs, wherein each processor design has a processor computational power and a processor power output, wherein selecting a processor design includes choosing a processor design as a function of the allocated processor computational power and the allocated processor power budget.

33. The method according to claim 32, wherein choosing a processor design as a function of the allocated processor computational power and the allocated processor power budget includes weighting a contribution of the allocated processor computational power more than a contribution of the allocated processor power budget.

34. The method according to claim 32, wherein the computational density is expressed in floating point operations per second for a given volume.

35. The method according to claim 32, wherein the computational density is expressed in operations per second for a given volume.

36. The method according to claim 32, wherein the computational density is expressed in performance on a performance benchmark for a given volume.

37. The method according to claim 32, wherein selecting a quantity of processor nodes includes selecting a method of interconnecting the processor nodes.

38. The method according to claim 32, wherein the processor computational power and the processor power output vary with frequency and voltage and wherein selecting a processor design from a plurality of processor designs includes selecting an appropriate frequency and voltage for each processor design.

39. The method according to claim 32, wherein the processor computational power and the processor power output vary with frequency and voltage and wherein selecting a processor design from a plurality of processor designs includes balancing frequency and voltage against processor power output for each processor design.

40. A computer design system, comprising:
  nonvolatile memory for storing information for a plurality of different processors, wherein the information includes information on processor operation for each of the different processors;
  means, connected to the nonvolatile memory, for selecting a computational density for a computer design;
  means, connected to the nonvolatile memory, for selecting a number of processors to use in the computer design;
  means, connected to the nonvolatile memory, for allocating a processor computational power across the selected number of processors;
  means, connected to the nonvolatile memory, for allocating a processor power budget across the selected number of processors; and
  means, connected to the nonvolatile memory, for selecting a processor from the plurality of different processors, wherein selecting includes determining the processor that provides an optimal computational density.

41. The method according to claim 40, wherein the processor computational power and the processor power output vary with frequency and voltage and wherein the means for selecting a processor design from a plurality of processor designs includes means for selecting an appropriate frequency and voltage for each processor design.

* * * * *